United States Patent
Moosrainer et al.

(10) Patent No.: US 7,681,108 B2
(45) Date of Patent: Mar. 16, 2010

(54) SEMICONDUCTOR MEMORY MODULE WITH ERROR CORRECTION

(75) Inventors: Karl-Heinz Moosrainer, München (DE); Srdjan Djordjevic, München (DE); Michael Bestele, München (DE)

(73) Assignee: Qimonda AG, Munich (DE)

( * ) Notice: Subject to any disclaimer, the term of this patent is extended or adjusted under 35 U.S.C. 154(b) by 909 days.

(21) Appl. No.: 11/488,919

(22) Filed: Jul. 19, 2006

(65) Prior Publication Data

US 2007/0033490 A1 Feb. 8, 2007

(30) Foreign Application Priority Data

Jul. 19, 2005 (DE) .................. 10 2005 033 710

(51) Int. Cl.
*G06F 11/10* (2006.01)
(52) U.S. Cl. .................. 714/767; 714/773
(58) Field of Classification Search .......... 714/767, 714/773
See application file for complete search history.

(56) References Cited

U.S. PATENT DOCUMENTS

| | | | | |
|---|---|---|---|---|
| 5,481,552 | A * | 1/1996 | Aldereguia et al. | 714/773 |
| 6,049,476 | A * | 4/2000 | Laudon et al. | 365/52 |
| 6,070,255 | A * | 5/2000 | Dell et al. | 714/48 |
| 6,108,730 | A * | 8/2000 | Dell et al. | 710/301 |
| 6,362,973 | B1 * | 3/2002 | Leddige et al. | 361/762 |
| 6,457,155 | B1 * | 9/2002 | Dell et al. | 714/773 |
| 6,737,738 | B2 * | 5/2004 | Koh et al. | 257/686 |
| 7,298,668 | B2 * | 11/2007 | Hoppe et al. | 365/233.1 |
| 7,375,983 | B2 * | 5/2008 | Djordjevic et al. | 361/818 |
| 7,414,312 | B2 * | 8/2008 | Nguyen et al. | 257/724 |
| 7,487,428 | B2 * | 2/2009 | Co et al. | 714/763 |
| 2001/0026009 | A1 * | 10/2001 | Tsunesa et al. | 257/673 |
| 2005/0047250 | A1 | 3/2005 | Ruckerbauer et al. | |
| 2005/0166026 | A1 * | 7/2005 | Ware et al. | 711/167 |
| 2006/0129755 | A1 * | 6/2006 | Raghuram | 711/105 |
| 2006/0171247 | A1 * | 8/2006 | Hoppe et al. | 365/233 |
| 2006/0179183 | A1 * | 8/2006 | Brittain et al. | 710/35 |
| 2007/0025131 | A1 * | 2/2007 | Ruckerbauer et al. | 365/63 |
| 2007/0258278 | A1 * | 11/2007 | Bacha et al. | 365/51 |
| 2009/0049365 | A1 * | 2/2009 | Kim et al. | 714/767 |

OTHER PUBLICATIONS

Micron Technology Inc., "DDR2 SDRAM Registered DIMM," Rev. A 5/05 EN Datasheet, 2003.

* cited by examiner

*Primary Examiner*—Stephen M Baker
(74) *Attorney, Agent, or Firm*—Edell, Shapiro & Finnan, LLC (57) ABSTRACT

A semiconductor memory module comprises a control chip for driving ECC memory chips and further memory chips. The memory chips are arranged in two rows on a top side and a bottom side of the module circuit board. The ECC memory chips are arranged centrally on the module circuit board alongside the rows of the memory chips. A control bus connects the ECC memory chips and also the memory chips to the control chip. In a region remote from the control chip, the control bus branches in a contact-making hole into a first partial bus, to which a first group of memory chips are connected, and a second partial bus, to which a second group of memory chips are connected. The ECC memory chips are likewise connected to the control bus via the contact-making hole. Since the ECC memory chips are not arranged directly under the control chip, a bus branch directed backward is not required. As a result, space considerations on the module circuit board are eased and signal integrity on the control buses is improved.

36 Claims, 8 Drawing Sheets

PRIOR ART

SEMICONDUCTOR MEMORY MODULE WITH ERROR CORRECTION

CROSS REFERENCE TO RELATED APPLICATIONS

This application claims priority under 35 USC §119 to German Application No. DE 102005033710.4, filed Jul. 19, 2005, and entitled "Semiconductor Memory Module with Error Correction," the entirety of which is incorporated herein by reference.

FIELD OF THE INVENTION

The present invention relates to a semiconductor memory module with an error correction, in which an ECC (error correcting code) memory chip is connected to a control chip via a control bus.

BACKGROUND OF THE INVENTION

Figure 1:
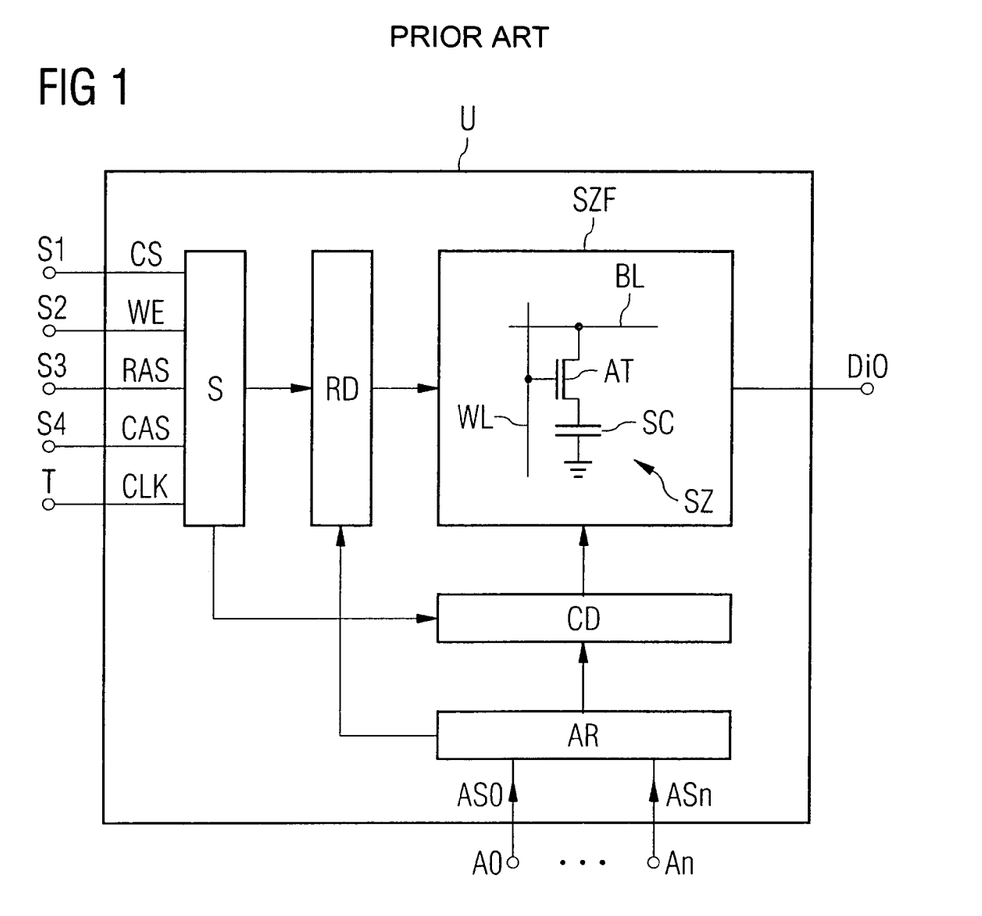
FIG. 1 shows a memory chip of a conventional semiconductor memory module.

FIG. 1 shows a conventional memory chip U, which is embodied for example as a DRAM (dynamic random access memory) memory chip. The memory chip U comprises a memory cell array SZF, in which memory cells SZ are arranged in matrix-like fashion along word lines WL and bit lines BL. A memory cell SZ comprises a selection transistor AT and a storage capacitor SC. In the case of a read or write access, the selection transistor AT is controlled to be put into an on state by a corresponding control signal on the word line WL. Consequently, the storage capacitor SC is connected to the bit line BL via the selection transistor AT controlled in the on state. In the event of a read access, data amplified by a sense amplifier (not illustrated in FIG. 1) can be fed via the bit line BL to a data terminal DIO for outputting. In the event of a write access, via the selection transistor AT controlled in the on state, data can be written to one of the memory cells SZ from the data terminal DIO via the bit line BL.

The memory chip U furthermore comprises a control circuit S with control terminals S1, S2, S3 and S4, to which external control signals CS, WE, RAS and CAS can be applied. Address terminals A0, . . . , An for application of address signals AS0, . . . , ASn are connected to an address register AR. An address signal presented at the address terminals is forwarded as a row address to a row decoder RD and as a column address to a column decoder CD.

Write and read accesses to the memory chip are synchronized to a clock signal CLK at a clock terminal T. In the event of a write access to a memory cell of the memory chip U, address signals AS0, . . . , ASn are supplied the address terminals A0, . . . , An to select one of the memory cells of the memory cell array SZF for the write access.

For selection of the memory chip U for the write access, a chip select signal CS is applied to the control terminal S1. Simultaneously with this, the row select signal RAS is applied to the control terminal S3. According to the applied row address, a word line WL of the memory cell array SZF is activated by the row decoder RD. As a result, all selection transistors AT which are connected along the activated word line are controlled to be put into an on state. For selection of a specific memory cell along the activated word line, subsequently the chip select signal CS is applied to the control terminal S1, the write enable signal WE is applied to the control terminal S2 and the column select signal CAS is applied to the control terminal S4. According to the column address applied to the address terminals, the column decoder CD activates one of the bit lines BL of the memory cell array for the write access. That memory cell that lies at a crossover point between the activated word line and the activated bit line is thereby selected for a write access.

After a precharge operation, during which all the bit lines of the memory cell array are brought to a common voltage, a read access can be made to one of the memory cells. For selection of the memory cell to be read, the address terminals A0, . . . , An are again driven by an address signal AS0, . . . , ASn containing a row address and a column address. For selection of the memory chip U for the read access, the control circuit S is driven by the chip select signal CS at the control terminal S1 and by the row select signal RAS at the control terminal S3. According to the applied row address, the row decoder RD selects one of the word lines WL and, by means of a corresponding voltage potential on the selected word line, activates all the memory cells SZ which are connected along the selected word line. Thereafter, the chip select signal CS is applied to the control terminal S1 and the column select signal CAS is applied to the control terminal S4. The column decoder CD in response selects one of the bit lines BL according to the column address. The memory cell that lies at a crossover point between the selected word line and the selected bit line is thereby selected for the read access.

Memory chips of this type are generally combined on a semiconductor memory module to form a larger memory unit. The individual memory chips on the semiconductor memory module can no longer be directly driven externally with control and address signals, but rather are shielded from the outside world by means of a control chip. A memory controller accesses the control chip, which in turn drives the individual memory chips on the semiconductor memory module for a read and write access with control signals, address signals and data signals.

Figure 2:
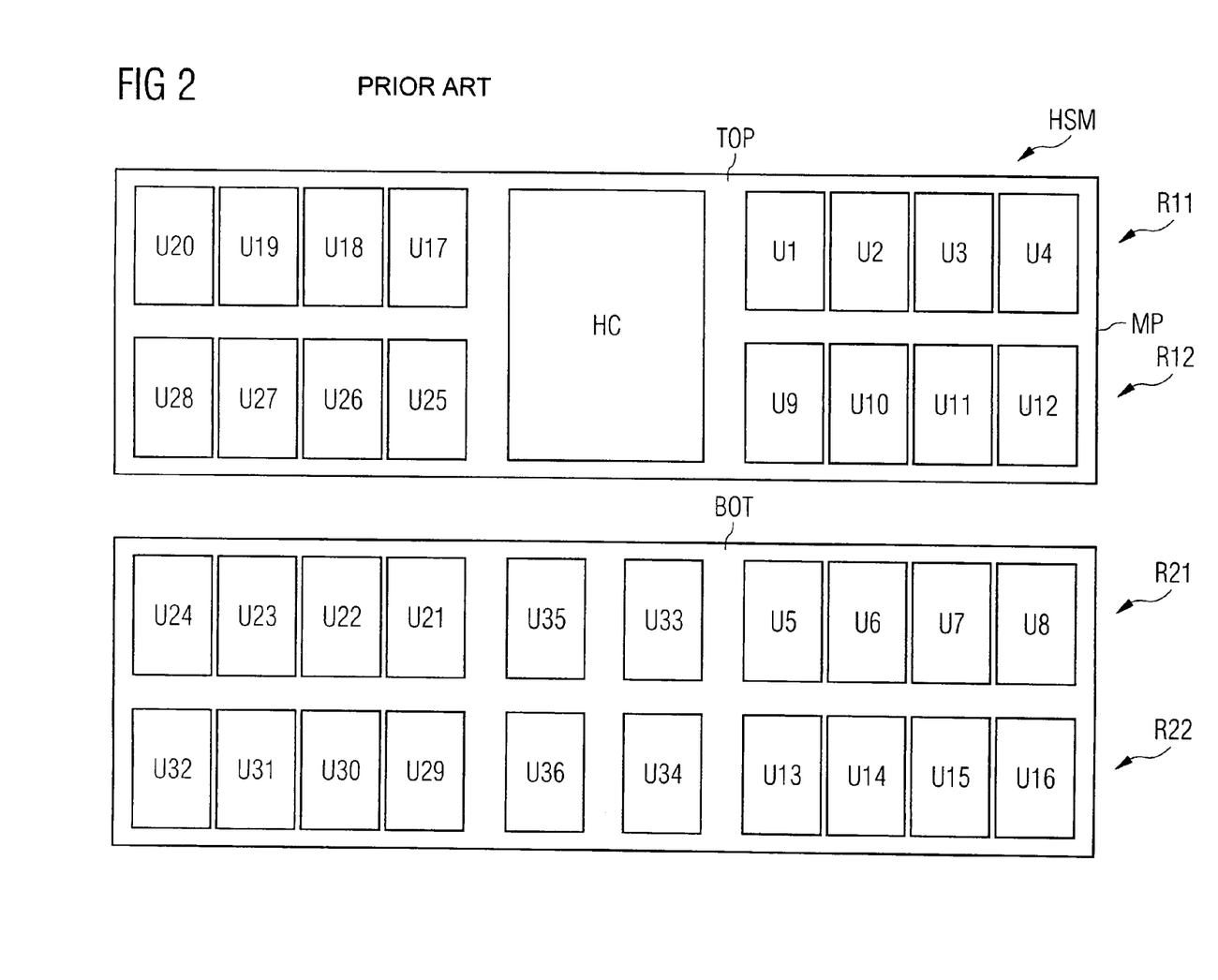
FIG. 2 shows a plan view of a top and bottom side of a conventional semiconductor memory module in accordance with an industry standard.

FIG. 2 shows a conventional semiconductor memory module HSM, in which a control chip HC is embodied as a hub chip, by way of example, and memory chips U1, . . . , U36 are arranged on a module circuit board MP. The semiconductor memory chips in the example of FIG. 2 have a ×4 organizational form. In the case of this organizational form, four items of data are simultaneously read into the memory cells of a memory chip in the event of a write access, and four items of data are simultaneously read out from the memory cells of a memory chip in the event of a read access. Those memory chips which are simultaneously addressed by the memory controller or the control chip HC in the event of an access to the semiconductor memory module are combined in groups, so-called ranks. The number of memory chips belonging to a rank is dependent on the bus width of the access bus with which the memory controller accesses the semiconductor memory module, and on the organizational form of the memory chips on the memory module. If the control chip is driven by a memory controller via an access bus having a bus width of 72 bits and the memory chips have the ×4 organizational form, it is possible, in the event of a read or write access to the semiconductor memory module, for four items of data in each case to be simultaneously read out from 18 memory chips or for four items of data in each case to be simultaneously written to 18 memory chips. A rank therefore comprises 18 memory chips. The semiconductor memory module of FIG. 2 comprises two ranks each having 18 memory chips and therefore represents a 2R×4 module configuration.

The module circuit board MP of FIG. 2 has a top side TOP and a bottom side BOT. In accordance with an industry standard for a memory module of the 2R×4 module configuration, the control chip HC is arranged in the center on the top side TOP of the module circuit board. The individual memory chips U1, . . . , U4, U9, . . . , U12, U17, . . . , U20 and U25, ..., U28 are arranged in two rows on the top side of the module circuit board on the left and right of the control chip.

The rest of the memory chips U5, ..., U8, U13, ..., U16, U21, ..., U24 and U29, ..., U32 are likewise arranged in two rows on the bottom side BOT of the module circuit board. The individual memory chips each contain a memory cell array SZF, as shown in FIG. 1, for storing data. The memory chips U33, U34, U35 and U36, which, in accordance with an industry standard, are positioned on the bottom side BOT of the module circuit board directly under the control chip HC, are embodied as ECC (error correcting code) memory chips. Data for error correction are stored in the memory cells of their memory cell array. When reading from a memory chip, a datum read out erroneously from a memory chip can be corrected by the control chip HC by means of such error correction data stored in the ECC memory chips.

In order to drive the individual memory chips and also the ECC memory chips with control and address signals, the control chip HC is connected to the individual memory chips and the ECC memory chips via a control bus CAB. The design of the control bus CAB for a memory module of the 2R×4 module configuration is explained hereinafter with reference to FIGS. 3 and 4.

Figure 3:
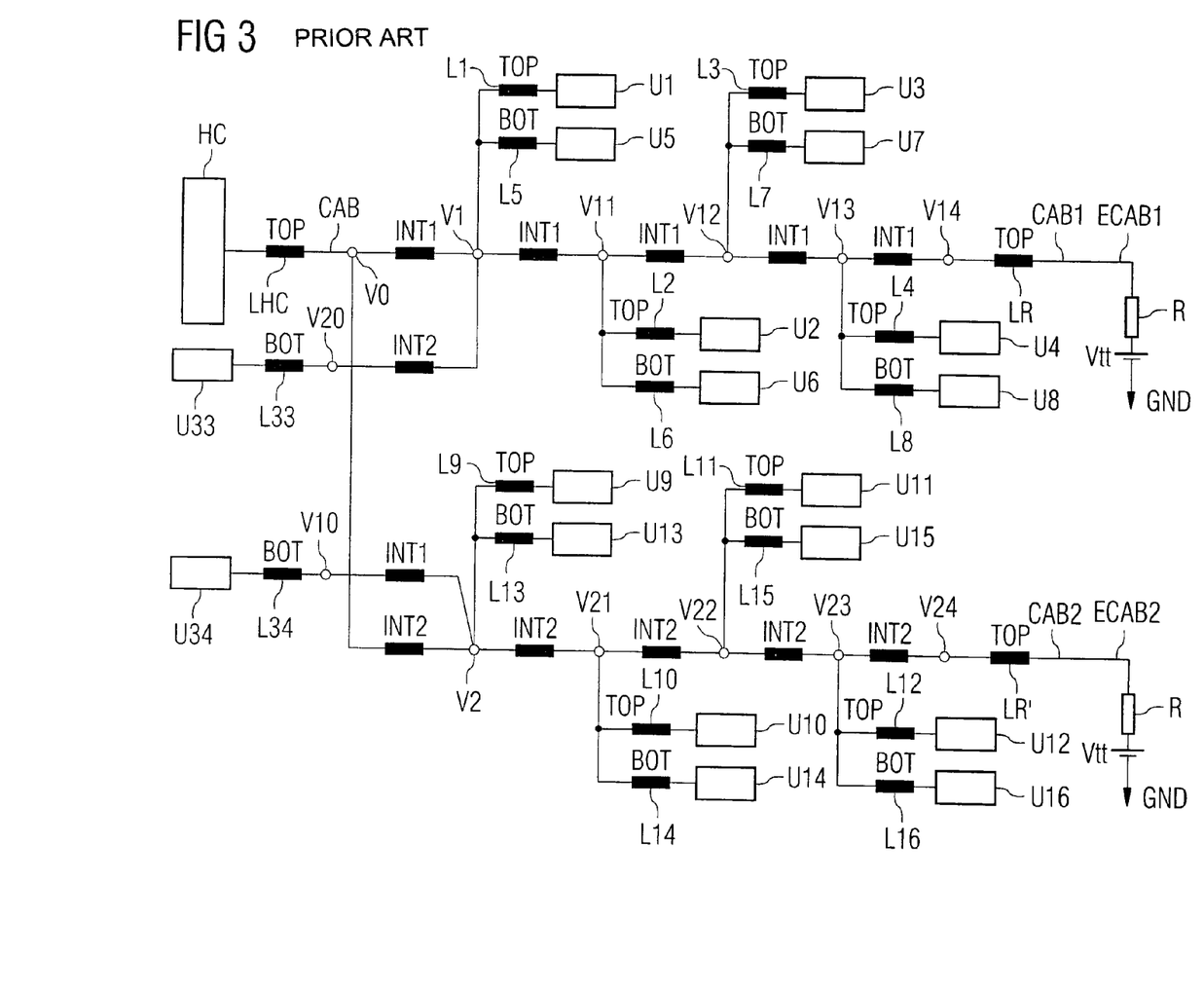
FIG. 3 shows a conventional bus architecture of a control bus via which ECC memory chips and further memory chips are connected to a control chip.

FIG. 3 shows a conventional control chip HC. The control chip HC is connected via the control bus CAB to the memory chips U1, ..., U4 in a row R11 on the top side TOP of the module circuit board, to the memory chips U9, ..., U12 in a row R12 on the top side TOP of the module circuit board, to the memory chips U5, ..., U8 in a row R21 on the bottom side BOT of the module circuit board, to the memory chips U13, ..., U16 in a row R22 on the bottom side of the module circuit board and to the two ECC memory chips U33 and U34.

Figure 4:
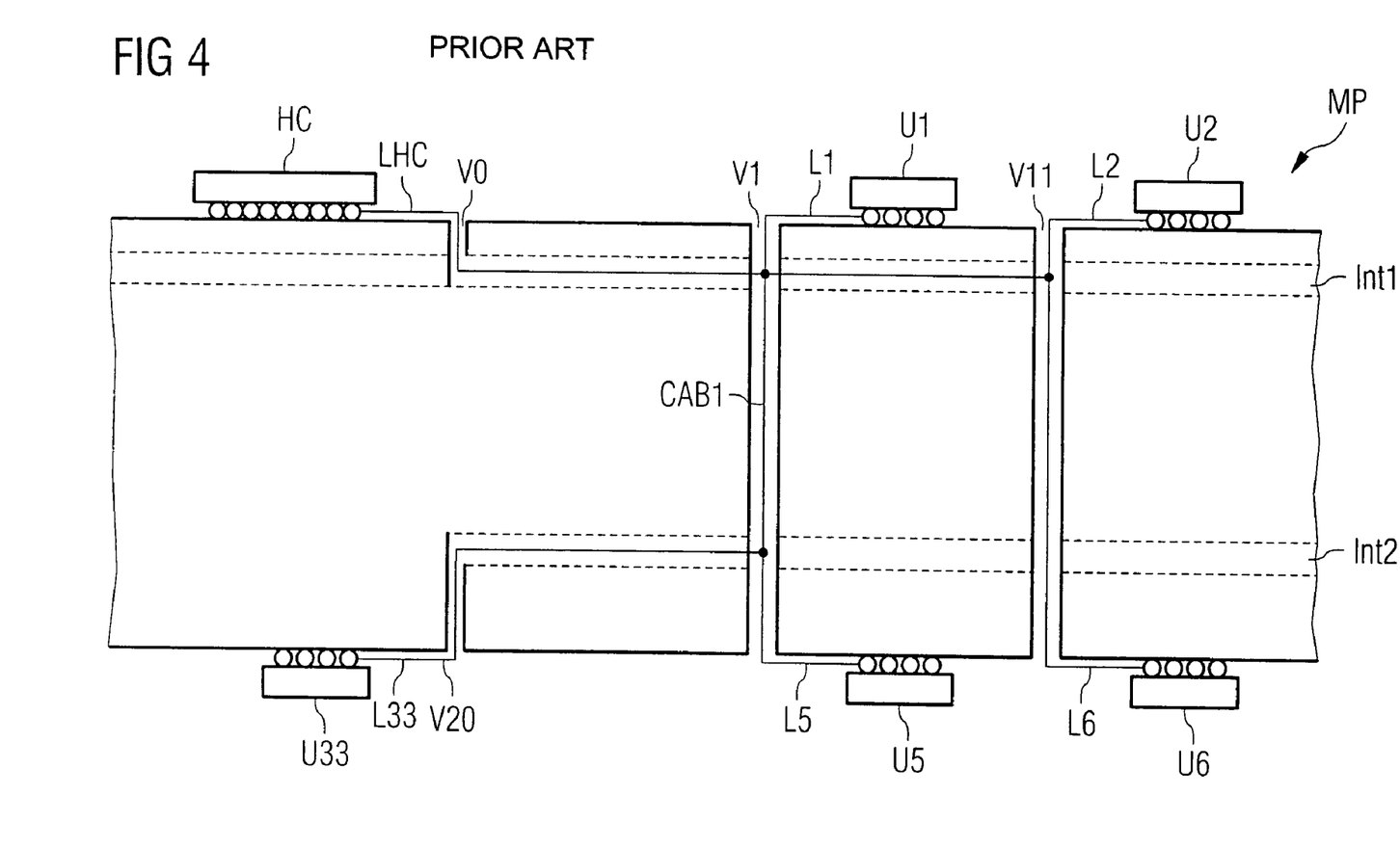
FIG. 4 shows a cross section through a conventional module circuit board with a bus architecture of a control bus for connecting ECC memory chips and further memory chips to a control chip in accordance with an industry standard.

FIG. 4 shows a detail from a cross section through a conventional module circuit board MP. The control chip HC and also the two memory chips U1 and U2 are arranged on the top side of the module circuit board. The ECC memory chip U33 is arranged on the bottom side of the module circuit board below the control chip HC. The memory chips U5 and U6 are arranged on the bottom side of the module circuit board under the memory chips U1 and U2. The control chip HC is connected to a contact-making hole V0 via a short conductor track LHC on the top side TOP of the module circuit board MP. The control chip HC is connected to the control bus CAB via the short conductor track LHC on the top side of the module circuit board and the contact-making hole V0.

The control bus CAB runs on an internal layer INT1 of the module circuit board. At the contact-making hole V1, the control bus CAB branches into a partial bus CAB1 and a partial bus CAB2. The memory chips U, ..., U4 of the row R11 on the top side of the module circuit board, the memory chips U5, U8 of the row R21 on the bottom side of the module circuit board and the ECC memory chip U33 are connected to the partial bus CAB1. FIG. 4 illustrates an example of only part of the partial bus CAB1.

The partial bus CAB1 runs on the internal layer INT1 as far as a contact-making hole V1. The memory chip U1 is connected to the partial bus CAB1 via a short conductor track L1 on the top side of the module circuit board and the contact-making hole V1. The memory chip U5 is connected to the partial bus CAB1 via a short conductor track L5 on the bottom side of the module circuit board and the contact-making hole V1. Proceeding from the contact-making hole V1, the partial bus CAB1 runs further along the internal layer INT1 to contact-making holes V11, V12 and V13. The memory chips U2 and U6 are connected to the partial bus CAB1 via the contact-making hole V11 and a short conductor track L2 on the top side of the module circuit board and, respectively, a short conductor track L6 on the bottom side of the module circuit board. The memory chips U3 and U7 are connected to the partial bus CAB1 via the contact-making hole V12 and a short conductor track L3 on the top side of the module circuit board and, respectively, a short conductor track L7 on the bottom side of the module circuit board. The memory chips U4 and U8 are connected to the partial bus CAB1 via the contact-making hole V13 and a short conductor track L4 on the top side of the module circuit board and, respectively, a short conductor track L8 on the bottom side of the module circuit board. Through a contact-making hole V14, the partial bus CAB1 is connected to the top side of the module circuit board and from there, via a short conductor track LR, to a terminating resistor R at its end ECAB1. The terminating resistor R is connected to a voltage supply Vtt.

The partial bus CAB2 runs on a further internal layer INT2 of the module circuit board. Proceeding from the contact-making hole V0, the partial bus CAB2 runs as far as a contact-making hole V2. The memory chips U9 and U13 are connected to the partial bus CAB2 via the contact-making hole V2 and a short conductor track L9 on the top side of the module circuit board and, respectively, a short conductor track L13 on the bottom side of the module circuit board. From the contact-making hole V2, the partial bus CAB2 runs further on the internal layer INT2 of the module circuit board via further contact-making holes V21, V22 and V23 as far as a contact-making hole V24. The memory chips U10 and U14 are connected to the partial bus CAB2 via the contact-making hole V21 and a short conductor track L10 on the top side of the module circuit board and, respectively, a short conductor track L14 on the bottom side of the module circuit board. The memory chips U11 and U15 are connected to the contact-making hole V22 via the contact-making hole V22 and a short conductor track L11 on the top side of the module circuit board and, respectively, a short conductor track L15 on the bottom side of the module circuit board. The memory chips U12 and U16 are connected via a short conductor track L12 on the top side of the module circuit board and, respectively, a short conductor track L16 on the bottom side of the module circuit board and the contact-making hole V23 to the internal layer INT2 and thus to the partial bus CAB2. An end ECAB2 of the partial bus CAB2 is terminated via a terminating resistor R and a voltage supply Vtt via the contact-making hole V24 and a short conductor track LR' on the top side of the module circuit board.

A branch of the partial bus CAB1, proceeding from the contact-making hole V1, runs along the internal layer INT2 in the backward direction of the ECC memory chip U33 as far as a contact-making hole V20 positioned below the contact-making hole V0 for connecting the ECC memory chip U33 to the control bus CAB. The ECC memory chip U33 is connected via a short conductor track L33 and the contact-making hole V20 to the branch of the partial bus CAB1 which runs on the internal layer INT2. The ECC memory chip U34 is also connected to the control bus CAB in a similar manner. Proceeding from the contact-making hole V2, a branch of the partial bus CAB2 runs along the internal layer INT1 of the module circuit board in the backward direction of the ECC memory chip U34 as far as a contact-making hole V10 and from there via a short conductor track L34 on the bottom side of the module circuit board to the ECC memory chip U34.

As is illustrated in FIGS. 3 and 4, the control bus CAB branches into a partial bus CAB1 and a partial bus CAB2 in the region of the contact-making hole V0. Proceeding from the contact-making hole V1, a branch of the partial bus CAB1 runs on the internal layer INT2 back to the ECC memory chip U33 again, which is positioned under the control chip HC on the module circuit board. Likewise, proceeding from the contact-making hole V2, a branch of the partial bus CAB2 runs via the internal layer INT1 back to the ECC memory chip U34 again, which is likewise arranged under the control chip HC on the bottom side of the module circuit board.

Figure 5:
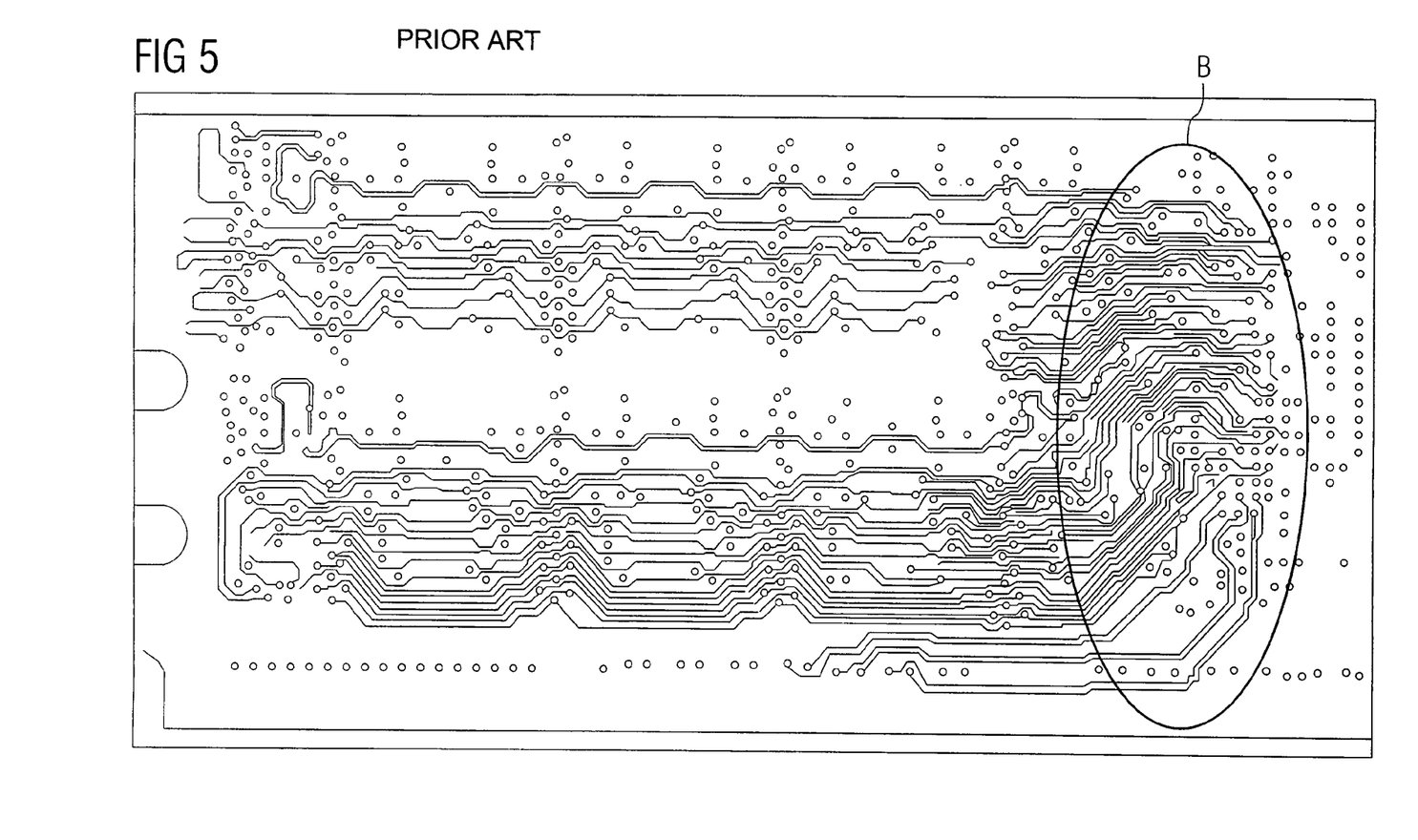
FIG. 5 shows contact-making holes and conductor tracks on an internal layer of a conventional module circuit board.

The contact-making holes V0, V1, V2, V10 and V20 are all arranged in a narrow region around the control chip HC. FIG. 5 shows a detail from an internal layer of a conventional module circuit board with contact-making holes and conductor tracks in a region B in the vicinity of the control chip HC. As shown in FIG. 5, a shortage of space occurs in this region by virtue of the numerous terminal connections of the control chip HC and also the numerous contact-making holes and bus lines, in particular due to the bus lines that run back in the direction of the ECC memory chips for the purpose of connecting to the ECC memory chips. Therefore, it is not possible to implement the branches of the partial buses CAB1 and CAB2 (for connecting the ECC memory chips to the control chip) in accordance with the standard shown in FIG. 3. In a 2R×4 module configuration this situation arises particularly when the input and output terminals of the control chip HC do not conform to a standard. In this case, the memory module, the positioning of the memory chips on the module circuit board and the bus architecture of the control bus have to be implemented in customized fashion. This is not desirable.

SUMMARY

Briefly, a semiconductor memory module having on-board error correction is provided in which the ECC memory chips are connected to a control chip via a control bus in a simple and space-saving manner. In one embodiment, the semiconductor memory module comprises a module circuit board having at least one an internal layer having a first surface and a second surface. A plurality of memory chips are provided each comprising a memory cell array having memory cells for storing data. First and second groups of the plurality of memory chips are arranged on the first surface of the module circuit board. A designated one of the plurality of memory chips stores data for error correction purposes. This is a so-called ECC memory chip. A control chip on the first surface of the circuit board drives the plurality of memory chips with control signals and corrects data read out erroneously from memory cells of the memory chips in the first group or second group of memory chips based on data for error correction that is stored in the designated memory chip. The designated memory chip is arranged on the first surface of the module circuit board between the control chip and the first and second groups of memory chips.

The invention is explained in more detail below with reference to figures showing non-limiting exemplary embodiments of thereof.

DETAILED DESCRIPTION

Figure 6:
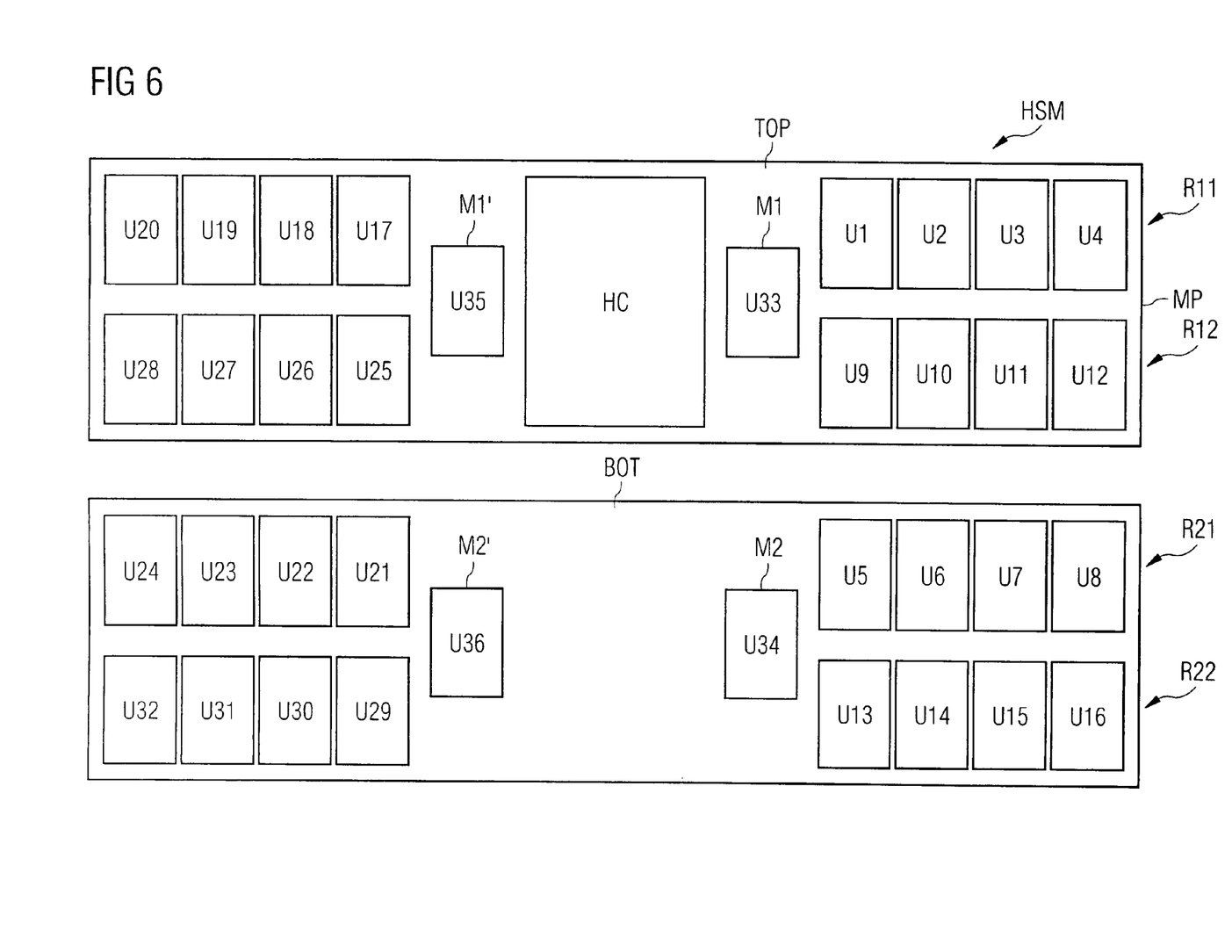
FIG. 6 shows an arrangement of a control chip, ECC memory chips and further memory chips on a top and bottom side of a module circuit board in accordance with an embodiment of the present invention.

Reference is first made to FIG. 6 that shows a semiconductor memory module HSM of the 2R×4 module configuration and chip positioning scheme according to an embodiment of the present invention. FIG. 6 shows a positioning arrangement for a control chip HC, memory chips that are designated ECC memory chips U33, U34, U35 and U36 and a plurality of memory chips U1, . . . , U32 in accordance with one aspect of the invention. The control chip HC is arranged in the center on the top side TOP (first surface) of the module circuit board MP. Either or both of the ECC memory chips (U33, U35) on the first surface of the circuit board MP is also referred to herein as a first designated memory chip and either or both of the ECC memory chips (U34, U36) on the second surface of the circuit board MP is also referred to herein as a second designated memory chip. The semiconductor memory module HSM may be a fully buffered dual in-line memory module.

The plurality of memory chips are grouped into first, second, third and fourth groups. The first and second groups of memory chips are arranged on the first surface of the module circuit board MP. The third and fourth groups of memory chips are arranged on the bottom side (second surface) of the module circuit board MP.

The first group of memory chips comprises memory chips U1, . . . , U4 arranged in a first row R11 and the second group of memory chips comprises memory chips U9, . . . , U12 arranged in an underlying or adjacent second row R12 adjacent to the first row on the side to the right of the control chip HC. Between the control chip HC and the two rows of memory chips, the ECC memory chip U33 is arranged centrally on the top side of the module circuit board MP at a center position M1 between the first and second groups of memory chips on the left side of the control chip HC.

The first group of memory chips may further comprise memory chips U17, . . . , U20 arranged in the first row R11 on the left side of the control chip HC. Similarly, the second group of memory chips may comprise memory chips U25, . . . , U28 arranged in the underlying second row R12 adjacent the first row R11 on the left side of the control chip HC. The ECC memory chip U35 is positioned in a center position M1' of the module circuit board between the two rows of memory chips on the left-hand side and the control chip HC.

The third group of memory chips comprises memory chips U5, . . . , U8 positioned in a first row R21 on the second surface of the module circuit board MP on the right-hand side of the control chip HC. Similarly, the fourth group of memory chips comprises memory chips U13, . . . , U16 positioned in a second row R22 adjacent the first row R21 on the bottom side (second surface) of the module circuit board MP on the right-hand side of the control chip HC. The third group of memory chips may further comprise memory chips U21, ..., U24 positioned in the row R21 on the left-hand side of the control chip HC and the fourth group of memory chips may further comprise memory chips U29, ..., U32 positioned in the underlying row R22 adjacent the first row R21 on the left-hand side of the control chip HC.

The ECC memory chip U34 is positioned alongside or adjacent the row R21 of memory chips U5, ..., U8 of the third group of memory chips and row R22 of memory chips U13, ..., U16 of the fourth group of memory chips at a center position M2 of the bottom side of the module circuit board. The ECC memory chip U36 is positioned alongside row R21 of memory chips U21, ..., U24 of the third group of memory chips and the row R22 of memory chips U29, ..., U32 of the fourth group of memory chips at a center position M2' on the bottom side of the module circuit board. That is, the position M2 is approximately equidistant to the rows of memory chips (that are part of the third and fourth groups of memory chips) on the right side of the control chip HC and the position M2' is approximately equidistant to the rows of memory chips (that are part of the third and fourth groups of memory chips) on left side of the control chip HC. Said another way, the ECC memory chip U34 is equidistant to the third and fourth groups of memory chips.

In contrast to the previous standard positioning of the memory chips, according to an embodiment of the present invention the ECC memory chips are not positioned on the bottom side under a region of the control chip HC. Instead, two of the four ECC memory chips are positioned on the top side TOP of the module circuit board on one side (left-hand side) and on the other side (right-hand side) of the control chip HC centrally between the control chip HC and the two rows of memory chips. In addition, the two ECC memory chips U34 and U36 are likewise not positioned in a region under the control chip HC but rather centrally alongside the two rows R21 and R22 on the bottom side BOT of the module circuit board.

Figure 7:
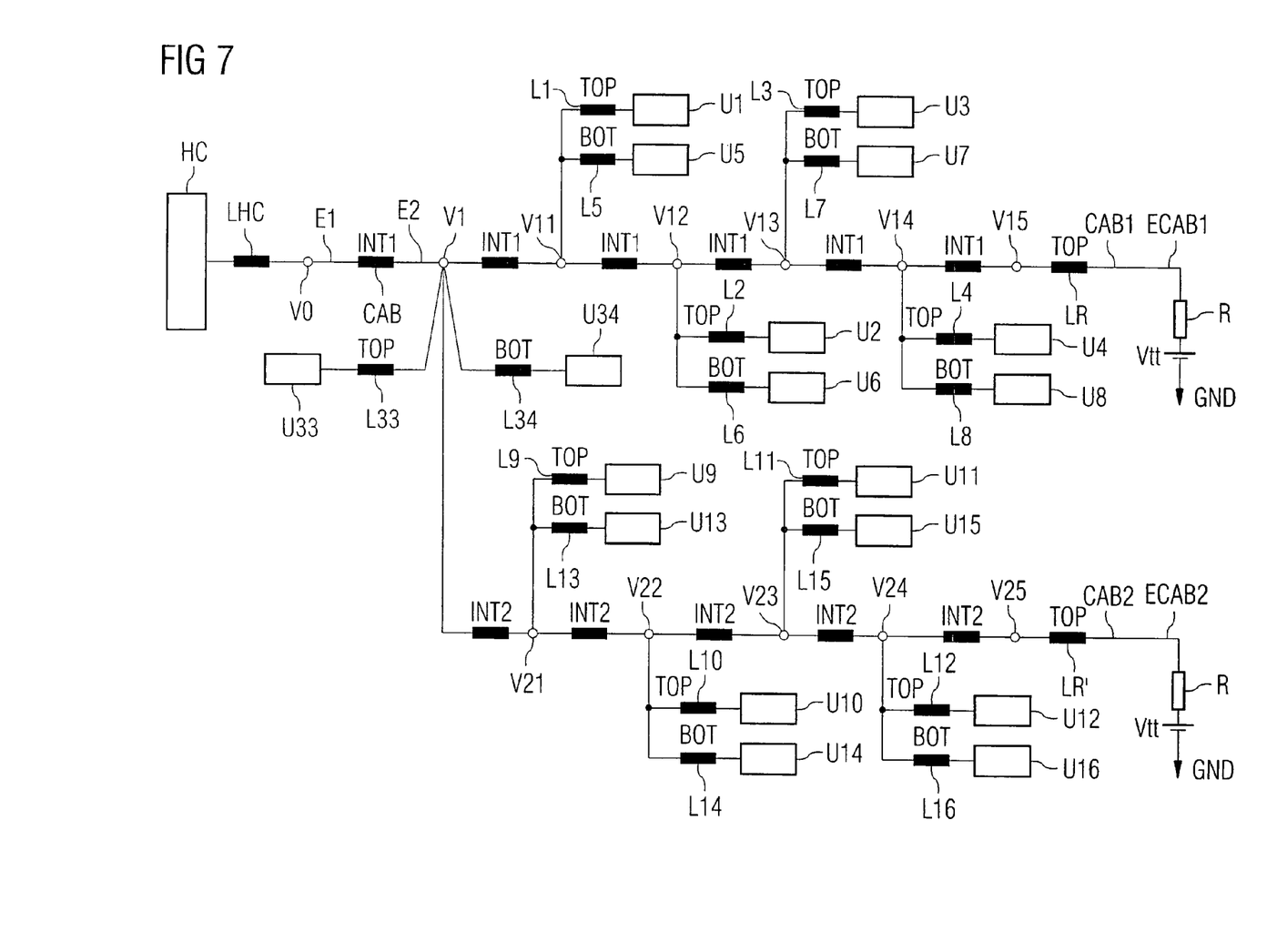
FIG. 7 shows a bus architecture of a control bus for connecting ECC memory chips and further memory chips to a control chip according to an embodiment of the invention.
Figure 8:
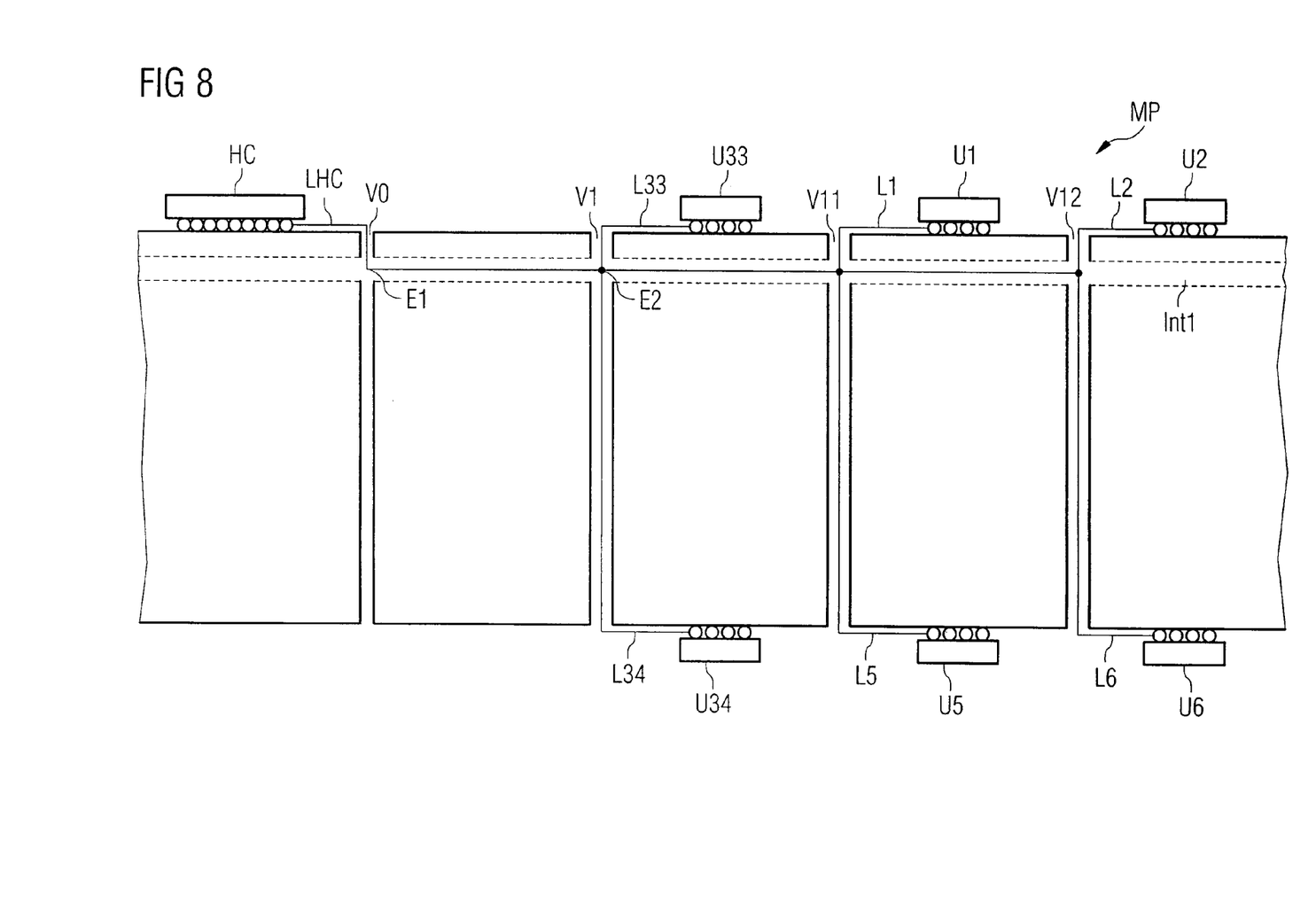
FIG. 8 shows a cross section through a module circuit board with a control bus for connecting ECC memory chips and further memory chips to a control chip according to an embodiment of the invention.

The connections of the ECC memory chips and of the further memory chips to the control chip via a control bus according to an embodiment of the present invention is explained with reference to FIGS. 7 and 8. FIGS. 7 and 8 shown connection arrangements for the memory chips arranged on the right-hand side of the module circuit board. However, the explanations below can likewise be applied to connections to be made to the memory chips positioned on the left-hand side of the module circuit board.

An end E1 of the control bus CAB is connected to the control chip HC via a contact-making hole V0 and a short conductor track (conductive trace) LHC on the top side of the module circuit board. Proceeding from the contact-making hole V0, the control bus CAB runs along an internal layer INT1 of the module circuit board as far as a contact-making hole V1, hereinafter referred to as a designated contact-making hole. At the contact-making hole V1, the control bus CAB branches into a partial bus CAB1 and a partial bus CAB2.

The partial bus CAB1 runs along the internal layer INT1. A first group or plurality of contact-making holes V11, V12, V13, V14 and V15 are arranged along the partial bus CAB1. The memory chips U1 and U5 are connected to the partial bus CAB1 via the contact-making hole V11 and a short conductor track L1 on the top side of the module circuit board and, respectively, a short conductor track L5 on the bottom side of the module circuit board. The memory chips U2 and U6 are connected to the partial bus CAB1 via the contact-making hole V12 and a short conductor track L2 on the top side of the module circuit board and, respectively, a short conductor track L6 on the bottom side of the module circuit board. The memory chips U3 and U7 are connected to the partial bus CAB1 via the contact-making hole V13 and a short conductor track L3 on the top side of the module circuit board and, respectively, a short conductor track L7 on the bottom side of the module circuit board. The memory chips U4 and U5 are connected to the partial bus CAB1 via a short conductor track L4 on the top side of the module circuit board and, respectively, a short conductor track L8 on the bottom side of the module circuit board and the contact-making hole V14. An end ECAB1 of the partial bus CAB1 is connected to a supply voltage Vtt via a terminating resistor R by way of the contact-making hole V15 and a short conductor track LR on the top side of the module circuit board.

The partial bus CAB2 runs along an internal layer INT2 of the multilayer module circuit board MP. A second group or plurality of contact-making holes V21, V22, V23, V24 and V25 are arranged along the partial bus CAB2. The memory chips U9 and U13 are connected to the partial bus CAB2 via the contact-making hole V21 and a short conductor track L9 on the top side of the module circuit board and, respectively, a short conductor track L13 on the bottom side of the module circuit board. The memory chips U10 and U14 are connected to the partial bus CAB2 via the contact-making hole V22 and a short conductor track L10 on the top side of the module circuit board and, respectively, a short conductor track L14 on the bottom side of the module circuit board. The memory chips U11 and U15 are connected to the partial bus CAB2 via the contact-making hole V23 and a short conductor track L11 on the top side of the module circuit board and, respectively, a short conductor track L15 on the bottom side of the module circuit board. The memory chips U12 and U16 are connected to the contact-making hole v24 via a short conductor track L12 on the top side of the module circuit board and, respectively, a short conductor track L16 on the bottom side of the module circuit board. An end ECAB2 of the partial bus CAB2 is connected to a voltage supply Vtt via a terminating resistor R via a short conductor track LR' on the top side of the module circuit board and the contact-making hole V25.

The ECC memory chip U33 on the top side of the module circuit board is connected to the control bus CAB via a short conductor track L33 on the top side of the module circuit board and the contact-making hole V1. The ECC memory chip U34 on the bottom side of the module circuit board is connected to the control bus CAB via a short conductor track L34 on the bottom side of the module circuit board and the contact-making hole V1. In contrast to the conventional connection of the ECC memory chip U33 to the control chip HC, a backward directed branch of the partial bus CAB1 on an internal layer INT2 is not required with the bus architecture of the control bus according to an embodiment of the present invention. Similarly, a backward directed bus branch of the partial bus CAB2 along the internal layer INT1 is not required in contrast to the conventional connection arrangement shown in with FIG. 3 for connecting the ECC memory chip U34 to the control chip HC.

The bus architecture arrangement according to embodiments of the present invention avoids the need for conductor tracks on internal layers of the module circuit board in a region B that is closely adjacent to the control chip HC in the conventional architecture shown in FIG. 5. Consequently, more space is available on internal layers of the module circuit board in the region adjacent to the control chip HC with the bus architecture arrangement embodiments of the present invention.

In the region B adjacent to the control chip HC, four contact-making holes, of which only the contact-making hole V20 is shown in FIG. 4, were previously necessary for connecting the ECC memory chips all positioned on the bottom side of the module circuit board below the control chip HC. In accordance with FIG. 7 and FIG. 8, only one contact-making hole V0 is required in the region B adjacent to the control chip HC, which contact-making hole connects the control chip HC to an end E1 of the control bus CAB. The branching to the ECC memory chips is effected via contact-making holes, for example the contact-making hole V1, which lie in a region of the module circuit board that is further away from the control chip HC. The confined space situation on the module circuit board thus eases in the region B adjacent to the control chip HC.

Furthermore, the conventional bus architecture shown in FIG. 4 employs so-called blind contact-making holes (plated-through holes) for connecting the control chip HC to the control bus CAB and for connecting the ECC memory chips to the partial buses CAB1 and CAB2. The blind contact-making holes are required in the conventional bus architecture because continuous contact-making holes are used by the numerous input and output pins of the control chip HC and therefore there not enough continuous contact-making holes available for connecting the ECC memory chips to the branches of the partial buses CAB1 and CAB2. By contrast, in accordance with the bus architecture of the control bus CAB according to embodiments of the present invention it is possible to use continuous contact-making holes, such as the contact-making hole V1, for example, to connect the ECC memory chips to the control bus in the region B situated further away from the control chip HC. Continuous contact-making holes of this type can be produced significantly more cost-effectively than blind contact-making holes.

A further advantage of the design of the control bus according to embodiments of the present the invention is that avoiding returning bus branches improves the signal integrity of signals transmitted between the ECC memory chips and the control chip HC.

Furthermore, according to one aspect of the present invention, the ECC memory chips and the further memory chips are positioned in a symmetrical topology on the module circuit board. This results in a uniform load distribution for the partial bus CAB1 and the partial bus CAB2, making it possible to obtain good signal integrity on the partial buses.

LIST OF REFERENCE NUMERALS

AR Address register
AT Selection transistor
BL Bit line
BOT Bottom side of the module circuit board
CAB Control bus
CAB1, CAB2 Partial bus
CAS Column select signal
CD Row decoder
CLK Clock signal
CS Chip select signal
DIO Data terminal
HC Control chip
HSM Semiconductor memory module
INT Internal layer of the module circuit board
L Conductor track
MP Module circuit board
R Row
R Terminating resistor
RAS Row select signal
RD Column decoder
S Control circuit
SC Storage capacitor
SZ Memory cell
SZF Memory cell array
TOP Top side of the module circuit board
U Memory chip
V Contact-making hole
WE Write enable signal
WL Word line

What is claimed is:

1. A semiconductor memory module with on-board error correction capability, comprising:
   a module circuit board having at least one an internal layer having a first surface and a second surface;
   a plurality of memory chips each comprising a memory cell array having memory cells for storing data, the plurality of memory chips comprising first and second groups of the plurality of memory chips arranged on the first surface of the module circuit board, wherein a designated memory chip stores data for error correction purposes;
   a control chip on the first surface of the circuit board that drives the plurality of memory chips with control signals and corrects data read out erroneously from memory cells of the memory chips in the first group or second group of memory chips based on data for error correction that is stored in the designated memory chip;
   wherein said designated memory chip is arranged on the first surface of the module circuit board between the control chip and the first and second groups of memory chips.

2. The semiconductor memory module as claimed in claim 1, wherein the first group of memory chips are being arranged in a first row on the first surface of the module circuit board (MP).

3. The semiconductor memory module as claimed in claim 2, wherein the second group of memory chips from are arranged in a second row on the first surface of the module circuit board, wherein the second row on the first surface of the module circuit board being arranged adjacent the first row on the first surface of the module circuit board.

4. The semiconductor memory module as claimed in claim 3, wherein said designated memory chip is centrally positioned between the control chip and the first and second groups of memory chips.

5. The semiconductor memory module as claimed in claim 4, and further comprising a control bus that comprises a first end connected to the control chip and which transmits the control signals along the internal layer of the module circuit board, wherein the module circuit board comprises a plurality of contact-making holes extending from the first surface of the module circuit board at least to the internal layer and a second end of the control bus connected to a designated contact-making hole of the plurality of contact-making holes, wherein said designated memory chip is connected to the control bus via a conductor track on the first surface of the module circuit board and via said designated contact-making hole.

6. The semiconductor memory module as claimed in claim 5, wherein the control bus branches into a first partial bus and a second partial bus at designated contact-making hole, wherein the first group of memory chips are connected to the first partial bus along a length thereof, and the second group of memory chips are connected to the second partial bus along a length thereof.

7. A semiconductor memory module with on-board error correction capability, comprising:
- a module circuit board having at least one an internal layer having a first surface and a second surface;
- a plurality of memory chips each comprising a memory cell array having memory cells for storing data, the plurality of memory chips comprising a first group of the plurality of memory chips arranged in a first row on the first surface of the module circuit board and a second group of the plurality of memory chips arranged in a second row adjacent the first row on the first surface of the module circuit board, wherein a first designated memory chip stores data for error correction purposes and the first designated memory chip is arranged on the first surface of the module circuit board adjacent the first and second groups of memory chips; and
- a control chip on the first surface of the circuit board that drives the plurality of memory chips with control signals and corrects data read out erroneously from memory cells of the memory chips in the first group or second group of memory chips based on data for error correction that is stored in the first designated memory chip.

8. The semiconductor memory module as claimed in claim 7, wherein the first designated memory chip is centrally positioned between the control chip and the first and second groups of memory chips.

9. The semiconductor memory module as claimed in claim 8, and further comprising a control bus that comprises a first end connected to the control chip and which transmits the control signals along the internal layer of the module circuit board, wherein the module circuit board comprises a plurality of contact-making holes extending from the first surface of the module circuit board at least to the internal layer and a second end of the control bus connected to a designated contact-making hole of the plurality of contact-making holes, wherein the first designated memory chip is connected to the control bus via a conductor track on the first surface of the module circuit board and via said designated contact-making hole.

10. The semiconductor memory module as claimed in claim 9, wherein the control bus branches into a first partial bus and a second partial bus at designated contact-making hole, wherein the first group of memory chips are connected to the first partial bus along a length thereof, and the second group of memory chips are connected to the second partial bus along a length thereof.

11. The semiconductor memory module as claimed in claim 10, and further comprising a third group of memory chips arranged in a first row on the second surface of the module circuit board, and a fourth group of memory chips arranged in a second row adjacent the first row on the second surface of the module circuit board, wherein a second designated memory chip stores data for error correction purposes, and wherein the control chip corrects data read out erroneously from the third or fourth group of memory chips based on data for error correction stored in the second designated memory chip, and wherein the second designated memory chip is arranged on the second surface of the module circuit board adjacent the third and fourth groups of memory chips.

12. The semiconductor memory module as claimed in claim 11, wherein the second designated memory chip is positioned on the second surface of the module circuit board equidistant to the third group of memory chips and fourth group of memory chips.

13. The semiconductor memory module as claimed in claim 12, wherein the third group of memory chips are connected to the first partial bus along a length thereof and the fourth group of memory chips are connected to the second partial bus along a length thereof.

14. A semiconductor memory module with on-board error correction capability, comprising:
- a module circuit board having at least one an internal layer having a first surface and a second surface;
- a plurality of memory chips each comprising a memory cell array having memory cells for storing data, the plurality of memory chips comprising a first group of the plurality of memory chips arranged in a first row on the first surface of the module circuit board and a second group of the plurality of memory chips arranged in a second row adjacent the first row on the first surface of the module circuit board, wherein a first designated memory chip stores data for error correction purposes and the first designated memory chip is arranged on the first surface of the module circuit board adjacent the first and second groups of memory chips;
- a control chip on the first surface of the circuit board that drives the plurality of memory chips with control signals and corrects data read out erroneously from memory cells of the memory chips in the first group or second group of memory chips based on data for error correction that is stored in the first designated memory chip; and
- a control bus that comprises a first end connected to the control chip and which transmits the control signals along the internal layer of the module circuit board;
- wherein the module circuit board comprises a plurality of contact-making holes extending from the first surface of the module circuit board at least to the internal layer and a second end of the control bus connected to a designated contact-making hole of the plurality of contact-making holes, wherein the first designated memory chip is connected to the control bus via a conductor track on the first surface of the module circuit board and via said designated contact-making hole.

15. The semiconductor memory module as claimed in claim 14, wherein the first designated memory chip is centrally positioned between the control chip and the first and second groups of memory chips.

16. The semiconductor memory module as claimed in claim 15, wherein the control bus branches into a first partial bus and a second partial bus at a designated contact-making hole, wherein the first group of memory chips are connected to the first partial bus along a length thereof, and the second group of memory chips are connected to the second partial bus along a length thereof.

17. The semiconductor memory module as claimed in claim 16, and further comprising a third group of memory chips arranged in a first row on the second surface of the module circuit board, and a fourth group of memory chips arranged in a second row adjacent the first row on the second surface of the module circuit board, wherein a second designated memory chip stores data for error correction purposes, and wherein the control chip corrects data read out erroneously from the third or fourth group of memory chips based on data for error correction stored in the second designated memory chip, and wherein the second designated memory chip is arranged on the second surface of the module circuit board adjacent the third and fourth groups of memory chips.

18. The semiconductor memory module as claimed in claim 17, wherein the second designated memory chip is positioned on the second surface of the module circuit board equidistant to the third group of memory chips and fourth group of memory chips.

19. The semiconductor memory module as claimed in claim 18, wherein the third group of memory chips are connected to the first partial bus along a length thereof and the fourth group of memory chips are connected to the second partial bus along a length thereof.

20. A semiconductor memory module with on-board error correction capability, comprising:

a multilayer module circuit board comprising a plurality of internal layers and a first surface and a second surface;

a plurality of memory chips each comprising a memory cell array having memory cells for storing data, the plurality of memory chips comprising a first group of the plurality of memory chips arranged in a first row on the first surface of the module circuit board and a second group of the plurality of memory chips arranged in a second row adjacent the first row on the first surface of the module circuit board, wherein a first designated memory chip stores data for error correction purposes and the first designated memory chip is arranged on the first surface of the module circuit board adjacent the first and second groups of memory chips;

control chip on the first surface of the circuit board that drives the plurality of memory chips with control signals and corrects data read out erroneously from memory cells of the memory chips in the first group or second group of memory chips based on data for error correction that is stored in the first designated memory chip;

a control bus that comprises a first end connected to the control chip and which transmits the control signals along one of the plurality of internal layers of the module circuit board;

wherein the module circuit board comprises a plurality of contact-making holes extending from the first surface of the module circuit board to one of the plurality of internal layers, wherein the first designated memory chip is connected to the control bus via a conductor track on the first surface of the module circuit board and via said designated contact-making hole.

21. The semiconductor memory module as claimed in claim 20, wherein the control chip is a hub chip.

22. The semiconductor memory module as claimed in claim 20, wherein the memory cells of the plurality of memory chips are dynamic random access memory cells.

23. The semiconductor memory module as claimed in claim 20, wherein the control bus branches into a first partial bus and a second partial bus at a designated contact-making hole, wherein the first group of memory chips are connected to the first partial bus along a length thereof, and the second group of memory chips are connected to the second partial bus along a length thereof.

24. A fully buffered dual in-line memory module comprising the semiconductor memory module as claimed in claim 20.

25. The semiconductor memory module as claimed in claim 20, wherein the control chip and the plurality of memory chips are arranged in a fine pitch ball grid array package on the module circuit board.

26. The semiconductor memory module as claimed in claim 25, wherein the first partial bus and the second partial bus are terminated with a terminating resistor (R) at one end thereof.

27. The semiconductor memory module as claimed in claim 20, wherein the semiconductor memory module is embodied in a 2R×4 module configuration.

28. The semiconductor memory module as claimed in claim 27, wherein the plurality of contact-making holes comprises a first group of contact-making holes arranged along the first partial bus and a second group of contact-making holes arranged along the second partial bus, wherein the first group of memory chips are connected to the first partial bus via a corresponding conductor track on the first surface of the multilayer module circuit board and via respective one of the first group of contact-making holes and the second group of memory chips are connected to the second partial bus via a respective conductor track on the first surface of the multilayer module circuit board and via a corresponding one of the second group of contact-making holes.

29. The semiconductor memory module as claimed in claim 28, and further comprising a third group of memory chips arranged in a first row on the second surface of the module circuit board, and a fourth group of memory chips arranged in a second row adjacent the first row on the second surface of the module circuit board, wherein a second designated memory chip stores data for error correction purposes, and wherein the control chip corrects data read out erroneously from the third or fourth group of memory chips based on data for error correction stored in the second designated memory chip, and wherein the second designated memory chip is arranged on the second surface of the module circuit board adjacent the third and fourth groups of memory chips.

30. The semiconductor memory module as claimed in claim 29, wherein the designated contact-making hole extends from the first surface of the multilayer module circuit board to the second surface of the multilayer module circuit board, and wherein the second designated memory chip is connected to the control bus via a conductor track on the second surface of the multilayer module circuit board and via the designated contact-making hole.

31. The semiconductor memory module as claimed in claim 30, wherein the third group of memory chips are connected to the first partial bus along a length thereof and the fourth group of memory chips are connected to the second partial bus along a length thereof.

32. The semiconductor memory module as claimed in claim 31, wherein the plurality of contact making holes extend from the first surface to the second surface of the module circuit board, and wherein the third group of memory chips are connected to the first partial bus via a respective conductor track on the second surface of the module circuit board and via a corresponding one of the first group of contact-making holes and the fourth group of memory chips are connected to the second partial bus via a respective conductor track on the second surface of the module circuit board and via a corresponding one of the second group of contact-making holes.

33. The semiconductor memory module as claimed in claim 32, wherein the control bus transmits a row select signal for selecting a row of the memory cell array of one of the plurality of memory chips.

34. The semiconductor memory module as claimed in claim 33, wherein the control bus further transmits a column select signal for selecting a column of the memory cell array of one of the plurality of memory chips.

35. The semiconductor memory module as claimed in claim 33, wherein the control bus transmits a write enable signal for enabling data to be written to the memory cells of the memory cell array of one of the plurality of memory chips.

36. The semiconductor memory module as claimed in claim 33, wherein the control bus transmits an address signal for selecting a memory cell of the memory cells of the memory cell array of one of the plurality of memory chips.

\* \* \* \* \*